(12) United States Patent
Letz

(10) Patent No.: US 7,924,569 B2
(45) Date of Patent: Apr. 12, 2011

(54) SEMICONDUCTOR DEVICE COMPRISING AN IN-CHIP ACTIVE HEAT TRANSFER SYSTEM

(75) Inventor: Tobias Letz, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/551,766

(22) Filed: Sep. 1, 2009

(65) Prior Publication Data

US 2010/0079959 A1 Apr. 1, 2010

(30) Foreign Application Priority Data

Sep. 30, 2008 (DE) .................. 10 2008 049 726

(51) Int. Cl.
*H05K 7/20* (2006.01)

(52) U.S. Cl. ........ 361/717; 361/718; 361/761; 257/706; 257/712; 257/713; 438/48; 438/55; 136/201; 136/205

(58) Field of Classification Search ............ 361/679.46, 361/679.54, 688, 689, 702–707, 734, 735, 361/739, 777–784, 794; 438/14–16, 48, 438/54, 55, 122, 589, 660, 928; 136/200–205, 136/212, 224, 230; 62/3.2, 3.3, 3.7; 165/80.3, 165/104.33, 185; 257/15, 59, 345, E21.027, 257/E21.259, E21.532, E21.082, 49, 773, 257/467, 712–718, 62, 633, 686, 414, 758, 257/760, 778; 174/15.1, 16.3, 252

See application file for complete search history.

(56) References Cited

U.S. PATENT DOCUMENTS

| | | | | |
|---|---|---|---|---|
| 3,766,444 A | * | 10/1973 | Bosch | 331/60 |
| 5,229,643 A | * | 7/1993 | Ohta et al. | 257/706 |
| 5,879,630 A | * | 3/1999 | Lescouzeres et al. | 422/82.02 |
| 5,956,569 A | * | 9/1999 | Shiu et al. | 438/48 |
| 6,230,497 B1 | | 5/2001 | Morris et al. | 62/3.7 |
| 6,250,085 B1 | * | 6/2001 | Tousson | 62/3.7 |
| 6,281,120 B1 | * | 8/2001 | Strnad | 438/660 |
| 6,476,483 B1 | * | 11/2002 | Adler et al. | 257/713 |
| 6,525,419 B1 | * | 2/2003 | Deeter et al. | 257/712 |
| 6,559,538 B1 | * | 5/2003 | Pomerene et al. | 257/712 |
| 6,563,227 B1 | | 5/2003 | Strnad | 257/930 |
| 6,588,217 B2 | * | 7/2003 | Ghoshal | 62/3.7 |
| 6,645,786 B2 | * | 11/2003 | Pomerene et al. | 438/54 |

(Continued)

FOREIGN PATENT DOCUMENTS

DE 101 32 763 B4 10/2007

(Continued)

OTHER PUBLICATIONS

Translation of Official Communication from German Patent Office for German Patent Application No. 10 2008 049 726.6 dated Jul. 24, 2009.

(Continued)

*Primary Examiner* — Michael V Datskovskiy

(74) *Attorney, Agent, or Firm* — Williams, Morgan & Amerson, P.C.

(57) ABSTRACT

By providing thermoelectric elements, such as Peltier elements, in a semiconductor device, the overall heat management may be increased. In some illustrative embodiments, the corresponding active cooling/heating systems may be used in a stacked chip configuration to establish an efficient thermally conductive path between temperature critical circuit portions and a heat sink of the stacked chip configuration.

25 Claims, 3 Drawing Sheets

U.S. PATENT DOCUMENTS

| | | | |
|---|---|---|---|
| 6,646,340 B2 * | 11/2003 | Deeter et al. | 257/712 |
| 6,717,261 B2 * | 4/2004 | Voigtlaender et al. | 257/728 |
| 6,743,972 B2 * | 6/2004 | Macris | 136/201 |
| 6,800,933 B1 * | 10/2004 | Mathews et al. | 257/712 |
| 7,034,394 B2 * | 4/2006 | Ramanathan et al. | 257/712 |
| 7,075,133 B1 * | 7/2006 | Padmanabhan et al. | 257/276 |
| 7,250,327 B2 * | 7/2007 | Sakamoto | 438/106 |
| 7,301,233 B2 * | 11/2007 | Lee et al. | 257/719 |
| 7,338,840 B1 * | 3/2008 | Padmanabhan et al. | 438/122 |
| 7,352,003 B2 * | 4/2008 | Zhang | 257/59 |
| 7,537,954 B2 * | 5/2009 | Ramanathan et al. | 438/55 |
| 7,544,883 B2 * | 6/2009 | Chen et al. | 136/224 |
| 7,556,869 B2 * | 7/2009 | Fukushima et al. | 428/816 |
| 7,656,027 B2 * | 2/2010 | Dangelo et al. | 257/713 |
| 2004/0251531 A1 | 12/2004 | Yang et al. | 257/686 |
| 2005/0121064 A1 * | 6/2005 | Seo | 136/200 |
| 2006/0012033 A1 | 1/2006 | Noguchi | 257/712 |
| 2006/0102223 A1 | 5/2006 | Chen et al. | 136/201 |
| 2006/0118934 A1 * | 6/2006 | Ishikawa et al. | 257/680 |
| 2006/0145356 A1 | 7/2006 | Liu et al. | 257/777 |
| 2007/0089773 A1 * | 4/2007 | Koester et al. | 136/230 |
| 2007/0144182 A1 | 6/2007 | Sauciuc et al. | 62/3.2 |
| 2009/0079063 A1 * | 3/2009 | Chrysler et al. | 257/720 |
| 2009/0321909 A1 * | 12/2009 | Gu et al. | 257/686 |

FOREIGN PATENT DOCUMENTS

| | | |
|---|---|---|
| DE | 112004002121 T5 | 12/2007 |
| JP | 01245549 A | 9/1989 |
| JP | 2003017638 A | 1/2003 |
| JP | 02003017638 A * | 1/2003 |
| WO | WO 2009/158287 A1 | 12/2009 |

OTHER PUBLICATIONS

PCT Search Report and Written Opinion from PCT/EP2009/006689 dated Apr. 27, 2010.

PCT Preliminary Report on Patentability from PCT/EP2009/006689 dated Oct. 26, 2010.

* cited by examiner

SEMICONDUCTOR DEVICE COMPRISING AN IN-CHIP ACTIVE HEAT TRANSFER SYSTEM

BACKGROUND OF THE INVENTION

1. Field of the Invention

The present disclosure generally relates to the field of fabricating integrated circuits, and, more particularly, to temperature management in 3-D devices.

2. Description of the Related Art

In modern integrated circuits, a very high number of individual circuit elements, such as field effect transistors in the form of CMOS, NMOS and PMOS elements, resistors, capacitors and the like are formed on a single chip area. Typically, feature sizes of these circuit elements are continuously decreasing with the introduction of every new circuit generation, thereby resulting in currently available integrated circuits formed by volume production techniques with critical dimensions of 50 nm or less and having an improved degree of performance in terms of speed and/or power consumption. Hence, the reduction in size of transistors is an important aspect in steadily improving device performance of complex integrated circuits, such as CPUs. The reduction in size is commonly associated with an increased switching speed, thereby enhancing signal processing performance at transistor level.

In addition to the large number of transistor elements, a plurality of passive circuit elements, such as capacitors, resistors, interconnect structures and the like, are typically formed in integrated circuits as required by the basic circuit layout. Due to the reduced dimensions of the active circuit elements, not only the performance of the individual transistor elements may be increased, but also their packing density may be improved, thereby providing the potential for incorporating increased functionality into a given chip area. For this reason, highly complex circuits have been developed which may include different types of circuits, such as analog circuits, digital circuits and the like, thereby providing entire systems on a single chip (SoC).

Although transistor elements are the dominant circuit element in highly complex integrated circuits which substantially determine the overall performance of these devices, other components, such as capacitors and resistors and in particular a complex interconnect system or metallization system, may be required, wherein the size of these passive circuit elements may also have to be adjusted with respect to the scaling of the transistor elements in order to not unduly consume valuable chip area.

Typically, as the number of circuit elements, such as transistors and the like, per unit area may increase in the device level of a corresponding semiconductor device, the number of electrical connections associated with the circuit elements in the device level also increases, typically even in an overproportional manner, thereby requiring complex interconnect structures which may be provided in the form of metallization systems including a plurality of stacked metallization layers. In these metallization layers, metal lines, providing the inner-level electrical connection, and vias, providing intra-level connections, may be formed on the basis of highly conductive metals, such as copper and the like, in combination with appropriate dielectric materials so as to reduce the parasitic RC (resistive capacitive) time constants, since, in sophisticated semiconductor devices, typically, signal propagation delay may be substantially restricted by the metallization system rather than the transistor elements in the device level. However, expanding the metallization system in the height dimension to provide the desired density of interconnect structures may be restricted by the parasitic RC time constants and the constraints imposed by the material characteristics of sophisticated low-k dielectrics. That is, typically, a reduced dielectric constant is associated with reduced mechanical stability of these dielectric materials, thereby also restricting the number of metallization layers that may be stacked on top of each other in view of yield losses during the various fabrication steps and the reduced reliability during operation of the semiconductor device. Thus, the complexity of semiconductor devices provided in a single semiconductor chip may be restricted by the capabilities of the corresponding metallization system and in particular by the characteristics of sophisticated low-k dielectric materials, since the number of metallization layers may not be arbitrarily increased.

For this reason, it has also been proposed to further enhance the overall density of circuit elements for a given size or area of a respective chip package by stacking two or more individual semiconductor chips, which may be fabricated in an independent manner, however, with a correlated design to provide, in total, a complex system while avoiding many of the problems encountered during the fabrication process for extremely complex semiconductor devices on a single chip. For example, appropriately selected functional units, such as memory areas and the like, may be formed on a single chip in accordance with well-established manufacturing techniques including the fabrication of a corresponding metallization system, while other functional units, such as a fast and powerful logic circuitry, may be formed independently as a separate chip wherein, however, respective interconnect systems may enable a subsequent stacking and attaching of the individual chips to form an overall functional circuit, which may then be packaged as a single unit. In other cases, power circuitry operated at moderately high voltages and having a high power consumption may be combined with sensitive control circuits, wherein both functional units may be provided in separate chips. Thus, a corresponding three-dimensional configuration may provide increased volume density of circuit elements and metallization features with respect to a given area of a package, since a significant larger amount of the available volume in a package may be used by stacking individual semiconductor chips. Although this technique represents a promising approach for enhancing volume packing density and functionality for a given package size for a given technology standard while avoiding extremely critical manufacturing techniques, for instance in view of stacking a large number of highly critical metallization layers, the heat management of these three-dimensional chip arrangements may be difficult, in particular when high power consuming chips are included, as will be described with reference to FIG. 1.

FIG. 1 schematically illustrates a cross-sectional view of a three-dimensional semiconductor configuration 100 according to a typical conventional architecture. In the example shown, the three-dimensional device 100 comprises a first semiconductor chip 110, which is to be understood as a chip including circuit elements based on a semiconductor material, such as silicon and the like. The first semiconductor chip 110 may comprise a substrate 111, for instance a semiconductor material, such a as a silicon material, or any other appropriate carrier material, such as glass and the like. Furthermore, a device layer 112 may be provided above the substrate 111, which may comprise a plurality of semiconductor-based circuit elements, such as transistors, capacitors, resistors and the like, as is required for obtaining the desired electrical functional behavior of the chip 110. For convenience, any such circuit elements are not shown in FIG. 1. Additionally, the chip 110 may comprise a metallization system 113, which may include one or more metallization layers to establish the electrical connections between the circuit elements in the device layer 112. Moreover, the metallization system 113 may provide an appropriate interconnect structure to enable an electrical connection to a second chip 120 that is attached to the first chip to form a three-dimensional chip configuration, thereby significantly enhancing the volume packing density of circuit elements for a given package volume, as discussed above. For instance, the corresponding interconnect structure may be provided in the form of vias 113A, which may extend through the metallization system 113 and may directly connect to the device level 112, if required. Similarly, the second chip 120 may comprise a substrate 121, such as a silicon material or any other appropriate carrier material for forming thereon an appropriate semiconductor material, for instance in the form of silicon, in order to define a device level 122, in and above which corresponding circuit elements may be provided. Furthermore, a metallization system 123 may be provided "above" the device level 122 and may comprise one or more metallization layers for providing the required electrical connections of the circuit elements in the device level 122 and an appropriate contact structure for connecting to the first chip 110. For example, the chips 110 and 120 may comprise appropriate bump structures on the basis of which an electrical connection may be established, thereby also attaching the chip 120 with a chip 110 in a mechanically reliable manner. For this purpose, the metallization system 123 may also comprise appropriate bumps or other contact elements (not shown) in combination with corresponding vias 123A for establishing the chip to chip connections. It should be appreciated that attaching the chips 110 and 120 by means of the corresponding metallization systems 113, 123, respectively, may be one of a plurality of possibilities. For example, if the number of chip-to-chip connections is moderately low, the chip 120 may be attached to the chip 110 by means of the substrate 121, wherein corresponding through hole vias may establish the electrical connection from the metallization system 113 to the device layer 122 of the chip 120. On the other hand, the metallization system 123 is then available for connecting to a carrier substrate 130, which may be attached to the chip 120, thereby allowing a moderately complex electrical interconnection system from the chip 120 to the carrier substrate 130, which in turn may provide electrical connection to the periphery (not shown). In still other cases, the substrates 111 and 121 may be attached to each other on the basis of corresponding through hole vias for establishing the required chip-to-chip connections, while the corresponding metallization systems 113 and 123 may be available for connecting to further chips, carrier substrates and the like, when a three-dimensional configuration of increased complexity is required. Furthermore, as shown in FIG. 1, the device 100 may comprise a heat sink 140 that is attached to the carrier substrate 130 and may provide an increased surface area for forced or natural convection of air. In other cases, the heat sink 140 may include sophisticated liquid-based cooling systems or may comprise electrically active cooling systems, such as Peltier elements and the like.

Typically, the semiconductor device 100 as shown in FIG. 1 may be formed on the basis of well-established process techniques including the formation of the chips 110 and 120 by using typical manufacturing techniques of semiconductor devices. That is, the chips 110 and 120 may be formed on dedicated wafers by performing a plurality of manufacturing steps for fabricating circuit elements in the corresponding device levels 112, 122, followed by manufacturing techniques for fabricating the corresponding metallization systems 113 and 123, wherein appropriate process steps are also included to provide the vias 113A, 123A for establishing the chip-to-chip connection in a later manufacturing phase. After completing the basic semiconductor chips, the corresponding carrier wafers may be separated into single chips, thereby providing a plurality of chips 110 and a plurality of chips 120. Thereafter, the chips 110, 120 may be aligned to each other and may be connected, for instance, using an adhesive, a corresponding bump structure including, for instance, a solder material, which may be reflowed to establish an electrical connection and also mechanically adhering the chip 110 to the chip 120. Similarly, the carrier substrate 130 may be attached to the resulting stacked chip configuration and finally the heat sink 140 may be installed. It should be appreciated that the process may involve a plurality of additional well-established packaging techniques, for instance encapsulating the chips 110, 120 after attaching to the carrier substrate 130.

During operation of the device 100 in the stacked configuration, heat is generated, for instance, substantially within the corresponding device levels 112 and 122 due to the operation of the corresponding circuit elements, for instance in the form of transistors, resistors and the like. Depending on the specific configuration, frequently, a chip with moderately high power consumption may be provided within the device 100, wherein a corresponding enhanced thermal connection to the heat sink 140 may be required so that the allowable operating temperature within the device levels 112 and 122 may not be exceeded. Thus, conventionally, it is difficult to provide an efficient heat dissipation for any intermediate chips, in particular if more than two individual chips are provided within the device 100, so that the increase in volume packing density may frequently not be compatible with the available heat dissipation capabilities of conventional stacked chip configurations. Thus, due to the reduced heat dissipation capabilities of the individual chips in the configuration 100, significant constraints with respect to overall complexity and thus power consumption of the corresponding individual chips as well as for their spatial arrangement within the three-dimensional configuration may be imposed, thereby reducing overall performance and efficiency of the conventional three-dimensional chip configurations.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and techniques in which the heat dissipation capabilities in semiconductor chips and in particular in three-dimensional stacked chip configurations may be enhanced by providing chip internal active heat transfer capabilities so that a current driven heat transfer may be established within a chip and also within a stacked chip configuration. Hence, overall volume packing density of three-dimensional semiconductor devices may be increased for a given package volume since, if desired, the corresponding active heat transfer systems may be incorporated together with functional circuits on one or more semiconductor chips. In other illustrative aspects disclosed herein, the chip internal heat transfer may be enhanced by the current driven heat transfer systems, which may also provide enhanced performance since corresponding heat transfer systems may be positioned strategically in the vicinity of "hot spot" areas, thereby locally relaxing constraints with respect to packing density and/or operating speed in temperature critical portions. Moreover, by providing active heat transfer systems, heating and cooling functions may readily be provided for temperature critical areas, for instance, enhanced cold temperature behavior may be accomplished, for instance on powering up a system, wherein activation of temperature critical circuit portions may be delayed until an appropriate operating temperature is achieved. In other illustrative aspects, the current driven heat transfer system may also be used for temperature monitoring tasks in which the temperature dependent voltage generated by the current driven heat transfer system may indicate a temperature difference of respective temperature reservoirs thermally connected to the heat transfer system. For example, an efficient temperature monitoring may be accomplished within a stacked chip configuration on the basis of the heat transfer system.

One illustrative stacked chip configuration disclosed herein comprises a first chip comprising a first substrate and first device features formed above the first substrate. Furthermore, a second chip is positioned above the first chip and comprises a second substrate and second device features formed above the second substrate, wherein at least some of the second device features form a current driven heat transfer system. Moreover, the stacked chip configuration comprises a heat sink located above the second chip and thermally coupled to the current driven heat transfer system.

One illustrative method disclosed herein relates to controlling temperature in a semiconductor device. The method comprises providing a current driven heat transfer system in a chip which is thermally connected to a first temperature reservoir and a second temperature reservoir located in the chip. Furthermore, the method comprises operating the current driven heat transfer system to cool one of the first and second temperature reservoirs when the semiconductor device is in a specified operating phase.

BRIEF DESCRIPTION OF THE DRAWINGS

The disclosure may be understood by reference to the following description taken in conjunction with the accompanying drawings, in which like reference numerals identify like elements, and in which.

Figure 1:
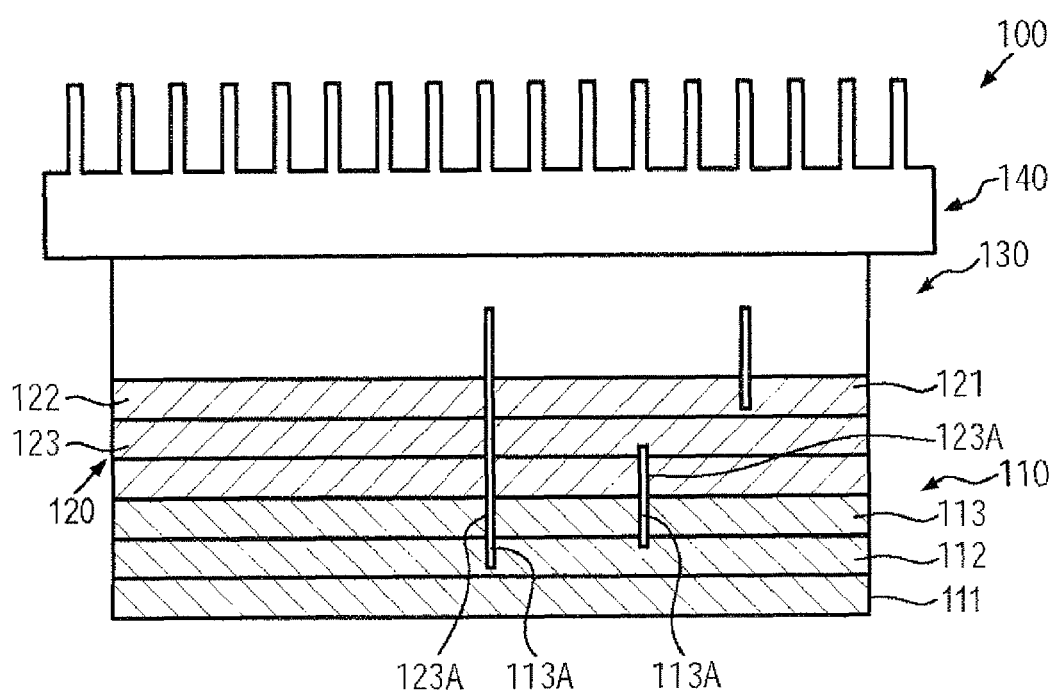
FIG. 1 schematically illustrates a cross-sectional view of a conventional three-dimensional chip configuration with restricted heat dissipation capabilities.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to semiconductor devices and techniques in which chip internal active or current driven heat transfer systems may be used to enhance the heat dissipation capabilities of complex semiconductor devices, which, in some illustrative embodiments, provide the possibility of establishing an "active" thermally highly conductive path in a stacked chip configuration. For instance, a corresponding active heat transfer system may readily be positioned in the vicinity of a hot spot, i.e., a performance driven circuit portion of the semiconductor device, for instance, a power circuit portion, a speed critical logic circuit portion and the like, wherein, in some illustrative embodiments, the corresponding heat transfer system may be positioned in a separate chip so that the increased heat dissipation capabilities may be positioned above or below the temperature critical circuit portion. Furthermore, in some illustrative embodiments, a "sequence" of heat transfer systems aligned to each other may provide efficient heat dissipation, which may finally terminate in a conventional heat sink, so that overall increased thermal conductivity may be established from the temperature critical circuit portion to the heat sink, even though one or more separate chips may be positioned between the temperature critical circuit portion under consideration and the final heat sink. Moreover, the provision of current driven heat transfer systems may also provide enhanced flexibility in operating complex integrated semiconductor devices, since the thermal conductivity provided by the active heat transfer systems may be enabled on demand, and may also provide reversing the heat flow direction, thereby allowing an efficient cooling and heating of temperature critical circuit portions, wherein the corresponding temperature control effect may be activated depending on the overall operational status of the semiconductor device. For example, in many applications, not only increased heat generation during operation may be critical for proper operation of the device but also cold temperature situations may result in incorrect operation or initialization of complex semiconductor devices. Thus, in this case, the active heat transfer system may be used to actively heat respective circuit portions to establish an appropriate operating temperature prior to actually activating the temperature critical circuit portion. For instance, in complex CPUs, the initialization of certain circuit portions upon a power-up event may be delayed until an appropriate operating temperature is attained, thereby avoiding complex redesigning of well-established circuit architectures in view of cold temperature operation capability, wherein, in other operating phases, the heat transfer system may then be used to monitor and/or actively dissipate heat from the temperature sensitive device portion. Consequently, in some illustrative embodiments, the active heat transfer system may be advantageously used in three-dimensional chip configurations, wherein, in some illustrative embodiments, temperature critical circuit portions, such as performance driven circuit portions, power electronics and the like, may be used without significant redesign in view of heat dissipation capabilities, or corresponding circuit portions may be provided with increased packing density since an efficient controllable heat dissipation capability may be positioned in close proximity "vertically" below and/or above the temperature critical circuit portion by incorporating the active heat transfer system into the circuit architecture of less critical circuit portions, such as memory areas, graphic controllers and the like. In other cases, the chip internal heat dissipation capabilities may be enhanced by appropriately positioning the current driven heat transfer system, for instance, in the metallization level of the corresponding chip while substantially not requiring significant redesigns in the device level or providing an even increased packing density in the device level compared to conventional semiconductor devices, since a more efficient redistribution of the heat generated in the device level into the metallization system may be accomplished. Similarly, in other illustrative embodiments, the current driven heat transfer system may, in addition to or alternatively, be formed in the substrate portion of the corresponding chip if considered appropriate.

In other illustrative aspects disclosed herein, the temperature dependent voltage obtained by the heat transfer system may also be used for monitoring the temperature of specific portions, which will also be referred to herein as temperature reservoirs that are thermally connected to the heat transfer system, thereby allowing enhanced overall temperature management in complex semiconductor devices, such as stacked chip configurations, since corresponding temperature dependent information may be obtained from within three-dimensional devices. Hence, by providing an appropriate control unit, the heat transfer system may be used as an efficient sensor system and, if required, may then be used for effectively heating or cooling a respective one of the corresponding temperature reservoirs. In still other illustrative embodiments, the temperature dependent voltage may be used, for instance, during a more or less stable operational phase of the semiconductor device in order to convert at least a fraction of the generated heat into electric energy, which may be used for supplying one or more circuit portions of the device. For instance, appropriate DC/DC converters may be used for adapting the voltage level obtained from the heat transfer system, acting as a voltage source, to the required supply voltage. For instance, for a corresponding temperature gradient of approximately 100° C. or higher, a corresponding efficiency of 3-4% may be obtained by a corresponding thermal electric generator so that 3-4% of the waste heat may be converted into usable electric energy, while still maintaining the possibility of heating and cooling temperature critical circuit portions, if required, by change of the environmental conditions, increased power consumption of corresponding circuit portions and the like.

With reference to FIGS. 2a-2d, further illustrative embodiments will now be described in more detail, wherein FIG. 1 may also be referred to, if appropriate.

Figure 2A:
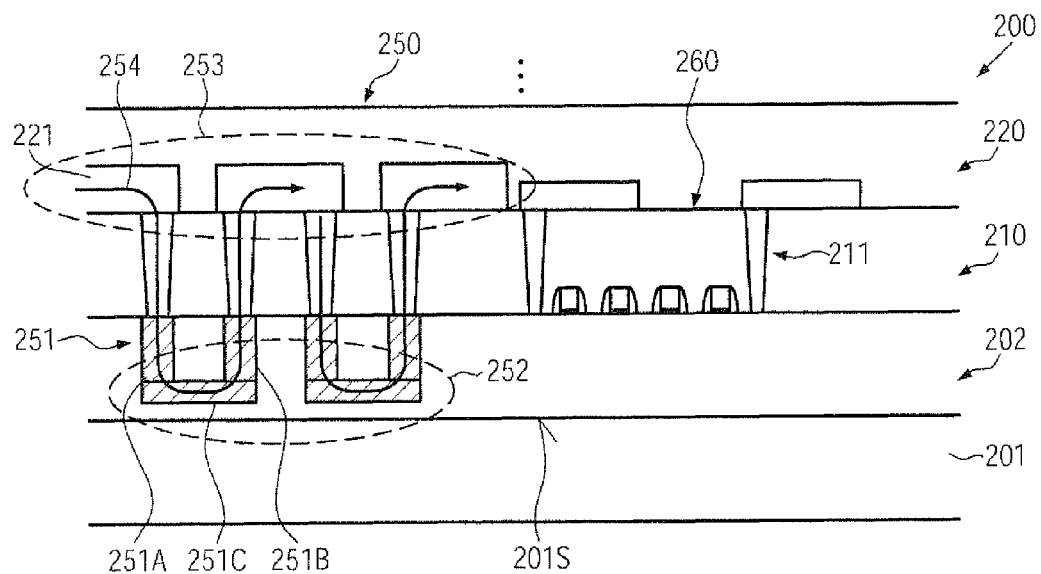
FIG. 2a schematically illustrates a cross-sectional view of a semiconductor device in which a chip internal active, i.e., current driven, heat transfer system may be provided in the substrate and/or the device level of the semiconductor device, according to illustrative embodiments.

FIG. 2a schematically illustrates a cross-sectional view of a semiconductor device 200 in which enhanced temperature management may be accomplished by providing a current driven heat transfer system 250. Moreover, the semiconductor device 200 may comprise, according to illustrative embodiments, one or more circuit portions 260, which may also be referred to as functional circuits and which may provide the electrical function as required for the circuit layout under consideration. For instance, the functional circuit 260 may represent digital circuitry, analog circuitry, a power circuit and the like. In some illustrative embodiments, the circuit portion 260 may comprise a plurality of circuit elements, such as field effect transistors and the like, which may form a memory circuit, a graphic processing circuit and the like, which may be used in combination with sophisticated logic circuitry, for instance in the form of a CPU core and the like, which may be provided as a separate chip entity and may be combined into a three-dimensional chip configuration with the semiconductor device 200. In other illustrative embodiments, the semiconductor device 200 may represent a "stand alone" integrated circuit chip, which may comprise all required components for obtaining the desired functional behavior. The semiconductor device 200 may comprise a substrate 201 which may be provided in the form of any appropriate carrier material for forming thereabove the current driven heat transfer system 250 and the functional circuit portion(s) 260. For instance, the substrate 201 may represent a semiconductor material, an insulating carrier material and the like. Moreover, a semiconductor layer 202 may be formed above the substrate 201 and may have any appropriate composition and crystallographic configuration as may be required for forming therein and thereabove the system 250 and the circuit portion 260. For instance, the semiconductor layer 202 may represent a silicon-based layer, as may typically be used as a base material for the fabrication of complex integrated circuits based on CMOS technology or any other semiconductor fabrication technologies. In other cases, any other appropriate semiconductor material, such as germanium, corresponding semiconductor compounds and the like, may be used. It should further be appreciated that other components, in addition to well-established semiconductor materials, such as silicon, may be used, for instance, the semiconductor layer 202, if substantially comprised of silicon, may also include significant amounts of germanium, carbon and the like, as may be required for the overall configuration of the device 200. In some illustrative embodiments, the substrate 201 and the semiconductor layer 202 may form a silicon-on-insulator (SOI) configuration in at least specific device areas of the device 200, when a corresponding buried insulating layer (not shown) may be positioned so as to electrically insulate the semiconductor layer 202 from the substrate 201 in the vertical direction. In this respect, it should be appreciated that any positional information, such as "vertical," "horizontal," "lateral," "below" and the like, are to be understood as referring to a reference plane, such as an interface 201S between the semiconductor layer 202 and the substrate 201 or a corresponding buried insulating layer, if provided. In this sense, the semiconductor layer 202 is positioned above the substrate 201.

Furthermore, the semiconductor device 200 may comprise a contact level 210 which may represent a device level in which a dielectric material may be provided to passivate circuit elements of the circuit portion 260, such as transistors, capacitors and the like, while also providing electrical connection to a metallization system 220. For this purpose, respective contact elements 211 may be provided in the contact level 210, which may connect to respective contact areas of circuit elements of the circuit portion 260 and to contact areas of corresponding device features 251 of the heat transfer system 250. The metallization system 220 may comprise one or more metallization layers including respective dielectric materials and metal lines and vias according to the overall circuit layout. For convenience, a single metallization layer is illustrated, wherein it should be appreciated that additional metallization layers may typically be required for appropriately connecting components of the system 250 and the circuit portion 260 and also provide electrical connections to peripheral components in the form of wire bond pads, solder bumps and the like, wherein corresponding connections to other chips may also be provided when the semiconductor device 200 is to be used in a three-dimensional semiconductor configuration, as is similarly also described with reference to FIG. 1.

The semiconductor device 200 comprising the current driven heat transfer system 250 may be formed on the basis of the following processes. After providing the substrate 201 and the semiconductor layer 202, appropriate isolation structures (not shown) may be formed to define respective active regions in the semiconductor layer 202 and also define corresponding regions for forming the heat transfer system 250 and the circuit portion 260. In some illustrative embodiments, manufacturing processes required for forming the heat transfer system 250 may be performed prior to respective manufacturing processes for forming the circuit elements of the circuit portion 260, while, in other cases, the components 251 of the system 250 may be formed during and/or after fabricating the circuit elements of the circuit portion 260. For example, the device features 251 may be provided in the form of different semiconductor elements 251A, 251B which may differ in the band gap energy and the like, so as to obtain a thermal electric effect similar to a Peltier element. For example, the components 251A, 251B may be comprised of silicon and germanium, respectively, thereby forming thermoelectric cells in combination with a corresponding conductive connector 251C. The component 251C may be provided in the form of a doped semiconductor material, a metal-containing material, such as a metal silicide and the like, depending on the overall process strategy. For example, if the device features 251 are formed prior to any high temperature processes required for forming the circuit elements of the circuit portion 260, corresponding materials with high temperature stability may be used, for instance in the form of doped semiconductor materials, carbon material and the like. In other cases, other material compositions, such as bismuth and telluride, may be used, depending on the overall process strategy. The device features 251 may be formed on the basis of appropriate implantation, etch and deposition techniques by, for instance, forming the connector elements 251C by implantation followed by etching respective trenches into the semiconductor layer 202, which may subsequently be coated with an insulating material on the sidewall portions thereof, followed by the deposition of the desired fill material. During the deposition process, other trenches requiring a different fill material may be masked and may be filled after the removal of any excess material deposited during the previous fill process. In other cases, respective trenches for one type of fill material may be formed first and may be filled, followed by a further etch and deposition cycle for the other type of fill material. It should be appreciated that the device features 251 may also be formed so as to extend into the substrate 201, even if the circuit portion 260 is to be formed on the basis of an SOI architecture. In this manner, a high vertical thermal conductivity may be accomplished for the heat transfer system 250, even if other areas of the semiconductor device 200 are formed on the basis of a buried insulating layer, which may typically reduce the efficiency of a vertical thermally conductive path. During the corresponding manufacturing sequence, if required, the device region corresponding to the circuit portion 260 may be masked if a corresponding influence of manufacturing processes is considered inappropriate. In other cases, at least some manufacturing steps may be performed concurrently with respective manufacturing processes used for forming the circuit elements of the circuit 260. Thereafter, corresponding manufacturing processes may be performed to provide the circuit elements, such as transistors, capacitors, resistors and the like, for the circuit portion 260 while masking the device region corresponding to the system 250, if required. The circuit elements of the circuit 260 may be formed on the basis of any appropriate process strategy, depending on the architecture of the corresponding circuit elements, such as CMOS technology and the like.

After completing the basic configuration of the circuit elements, the contact level 210 may be formed in accordance with well-established techniques, i.e., by depositing any appropriate dielectric materials and forming therein the contact elements 211, thereby also connecting the device features 251 as required for the overall operational behavior of the system 250.

Next, the metallization system 220 may be formed by well-established process techniques, wherein, also in the metallization system 220, respective interconnect structures may be provided to establish the required wiring layout for appropriately connecting the circuit elements of the portion 260 and the device features 251 of the heat transfer system 250. For instance, as indicated in FIG. 2a, respective metal lines 221 may establish a series connection of individual thermoelectric cells, each of which may be comprised of components 251A, 251C, 251B, so that a plurality of these basic thermoelectric cells may be electrically connected in series, while a "thermally parallel" connection may be established in which two different temperature levels or reservoirs may be defined. That is, a first temperature reservoir or level 252 may be defined by the substrate 201 in combination with the semiconductor layer 202, since a corresponding substantially uniform lateral heat distribution capability in this area may provide substantially the same temperature at the interfaces between the connecting elements 251C and the corresponding components 251A, 251B. A vertically oppositely arranged temperature reservoir 253 may be defined by the corresponding portion of the metallization system 220, possibly in combination with the contact level 210, since, also in this case, a substantially high degree of temperature uniformity in the lateral direction may be obtained due to the material characteristics of the reservoir 253. Consequently, upon establishing a current flow in the system 250, for instance as indicated by the arrow 254, a temperature gradient may be established between the temperature reservoirs 252 and 253, depending on the overall configuration of the system 250. That is, in one current flow direction, heat may be conveyed from the reservoir 252 to the reservoir 253, while, for the opposite current flow direction, heat may be transferred from the reservoir 253 to the reservoir 252. Thus, if a cooling effect is required at the reservoir 252, a corresponding current flow may be established to dissipate heat from the semiconductor layer 202 and/or the substrate 201 into the metallization system 220. This may be advantageous when, for instance, a significant amount of heat may be produced by the circuit 260, which may not be efficiently conducted into the metallization system 220, for instance if sophisticated low-k dielectric materials are used, which may not provide the required heat dissipation capabilities. In other cases, heat may be efficiently transferred from the metallization level 220 and the contact level 210 into the semiconductor layer 202 and the substrate 201, which may be advantageous if the circuit portion 260 is formed above a buried insulating layer, while the device features 251 may extend beyond the corresponding buried insulating layer and into deeper areas of the semiconductor layer 202 and/or the substrate 201. Thus, also in this case, enhanced temperature control of the circuit 260 may be accomplished.

In still other illustrative embodiments, the heat transfer system 250 may be used for establishing an efficient vertical thermally conductive path in a three-dimensional chip configuration, wherein the system 250 may be positioned so as to laterally correspond to a temperature critical circuit portion that may be provided in a separate chip or layer, as will be described later on in more detail.

Figure 2B:
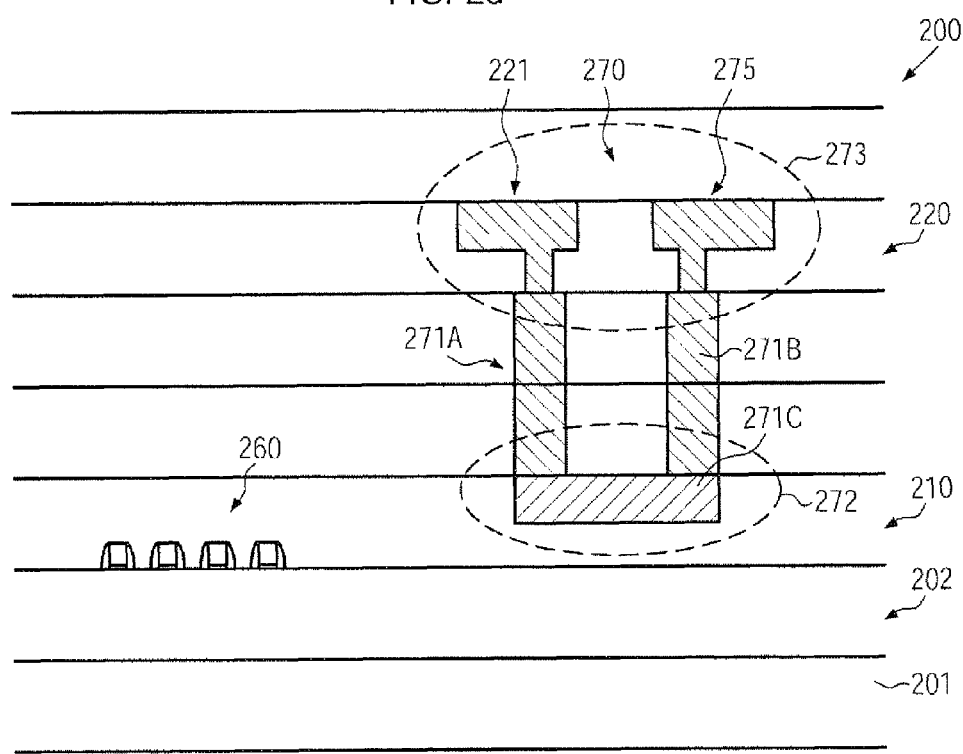
FIG. 2b schematically illustrates a cross-sectional view of a semiconductor device in which a chip internal active heat transfer system may be provided, at least partially, in the metallization system of the semiconductor device, according to further illustrative embodiments.

FIG. 2b schematically illustrates the semiconductor device 200 according to further illustrative embodiments in which, in addition to or alternatively to the heat transfer system 250 as shown in FIG. 2a, a heat transfer system 270 may be formed in the metallization system 220 and possibly in the contact level 210, depending on the overall process and device requirements. In the embodiment shown, the system 270 may comprise one or more thermoelectric elements 275, wherein only one is illustrated in FIG. 2b for convenience. The basic thermoelectric cell 275 may comprise corresponding device features 271A, 271B, which may represent materials of different thermoelectric behavior, such as different metals, such as copper in combination with constantan, or which may represent different semiconductor materials and the like. Furthermore, a connecting element 271C may be provided to electrically connect the components 271A, 271B, wherein the connecting element 271C may be comprised of the same material as one of the components 271A, 271B or may have formed therein a corresponding interface between the two different materials as also used in the components 271A, 271B, or the connecting element 271C may be comprised of any other material in order to establish the electrical connection required. Thus, in some cases, the thermoelectric cell 275 may be considered as a thermocouple comprising appropriate different metal materials, while, in other cases, typical materials as may be used for Peltier elements may be provided to form the basic thermoelectric cell 275. It should be appreciated that the metallization system 220 may further comprise appropriate additional metal features 221 in order to electrically connect a plurality of cells 275, as is also previously explained with reference to the heat transfer system 250 in the device level.

The heat transfer system 270 positioned in the metallization system 220 may be formed on the basis of process techniques that may also be used for other device features in the metallization system 220. For instance, corresponding trenches may be etched into the corresponding dielectric materials of the respective metallization layers and may be filled with an appropriate material, such as copper, possibly in combination with a barrier material and with constantan, i.e., a copper tin alloy, wherein well-established process techniques, such as electrochemical deposition in combination with sputter deposition and the like, may be used. In other cases, separate deposition processes may be performed in order to fill in an appropriate material, such as different semiconductor materials and the like, as previously described, wherein other device areas of the metallization system 220 may be protected on the basis of an appropriate masking regime. It should be appreciated that the heat transfer system 270 may also be positioned to provide enhanced heat transfer capabilities with respect to the circuit 260 or with respect to external circuit portions that may be provided in separate semiconductor chips and which are to be used in a three-dimensional stacked chip configuration, as will be described later on. Thus, similar as that described with reference to the system 250, upon establishing a current flow through the cell 275 and any other cells electrically connected in series or parallel thereto, a temperature gradient may be established between a first temperature zone or reservoir 272 and a second temperature zone or reservoir 273, depending on the current flow direction.

Figure 2C:
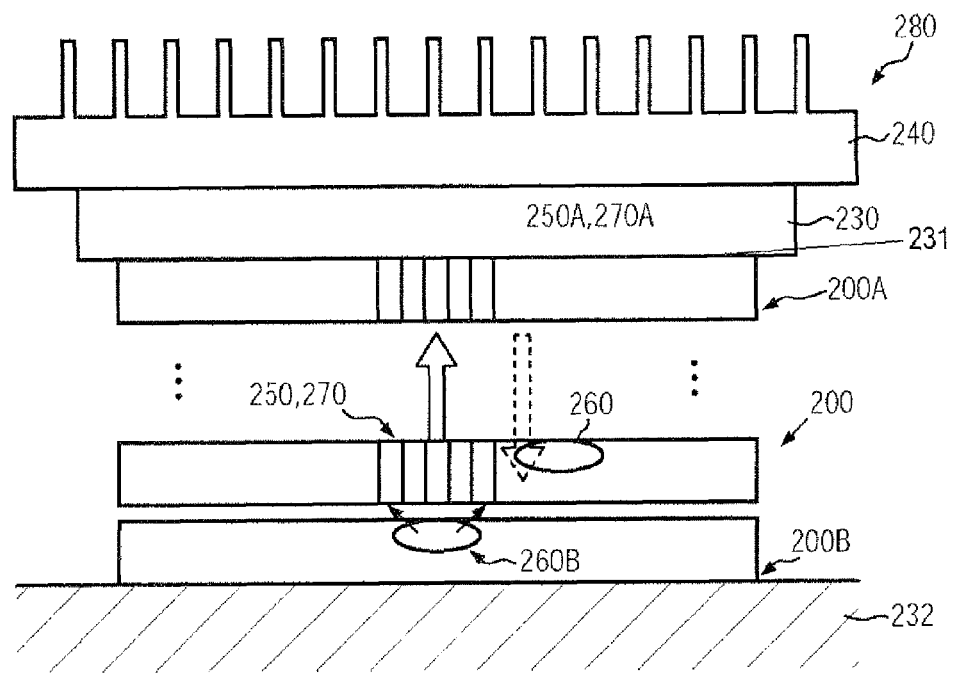
FIG. 2c schematically illustrates a cross-sectional view of a stacked chip configuration including a plurality of individual chips, at least some of which include an active heat transfer system to enhance the overall vertical heat transfer within the three-dimensional chip configuration, according to illustrative embodiments.

FIG. 2c schematically illustrates a stacked chip configuration 280 which may comprise a plurality of chips or semiconductor devices 200, 200A, 200B which may be attached to a package substrate 232, which may represent any appropriate carrier material for accommodating a plurality of semiconductor chips and providing respective contact pins and the like to connect to peripheral components, such as a printed wiring board and the like. For example, the semiconductor device or chip 200B may represent a first chip of the stacked configuration 280 and may be attached to the carrier material 232 on the basis of any appropriate contact regime, such as any appropriate adhesives, bump structures and the like, depending on the overall device requirements. In the embodiment shown, the semiconductor device 200B may comprise a temperature critical circuit portion 260B which may, for instance, be provided in the form of a complex speed critical logic circuitry, such as a portion of a CPU core and the like. Thus, the circuit portion 260B may represent a device region including sophisticated transistor elements that may be provided with a moderately high packing density and which may produce a significant amount of heat during operation. As is well known in sophisticated circuit designs, so-called hot spots may occur and may represent temperature critical device regions in which the overall power consumption may result in a significant heating, thereby locally raising the temperature above the temperature level as encountered in neighboring device regions. Consequently, corresponding temperature critical device areas may have to be redesigned to somewhat relax any temperature related constraints and/or the corresponding circuit portions may be operated at a reduced clock frequency and the like to reduce the overall power consumption, which may, however, result in overall reduced performance. Thus, in some illustrative embodiments, a corresponding heat transfer system such as the systems 250 and/or 270 of the device 200 may be appropriately positioned vertically above the temperature critical circuit 260B in order to establish a thermally conductive path between the temperature critical circuit portion 260B and a heat sink 240, which may be provided on a cover 230 of a corresponding package, wherein the cover 230 may be thermally connected to the last chip 200A of the stack by any appropriate intermediate heat transfer material 231. In one illustrative embodiment, each of the plurality of chips 200, 200A positioned above the first chip 200B may have formed therein an appropriately positioned heat transfer system, such as a system 250A, 270A, which may have any appropriate configuration, as is, for instance, previously described with reference to the device 200, so as to actively establish the heat transfer path between the chip 200B and the heat sink 240. In other illustrative embodiments, a vertical alignment of the corresponding heat transfer systems 250, 270, 250A, 270A may not be required for each of the chips 200, 200A when a corresponding lateral heat spreading capability within one of these chips may be considered sufficient to connect to an overlying heat transfer system that may be laterally offset with respect to a lower lying heat transfer system. Thus, depending on the overall complexity of the chips 200, 200A, the corresponding heat transfer systems may be positioned so as to substantially not interfere with a corresponding functional circuit portion that may be provided in the corresponding chips 200, 200A. In other cases, the corresponding functional circuit portions, such as the circuit portion 260 (FIGS. 2a and 2b), may be appropriately redesigned or repositioned in order to appropriately align the corresponding heat transfer system 250 and/or 270 with respect to the temperature critical portion 260B. It should be appreciated that, in other illustrative embodiments, the chip 200B may also comprise a current driven heat transfer system, if required. Similarly, the chip 200B comprising the temperature critical circuit portion 260B may be positioned at any other critical location within the stack 280, depending on the overall device requirements. In other cases, temperature critical circuit portions may also be provided in one or more of the further semiconductor chips 200, 200A, depending on the complexity of the device 280. For example, the speed critical circuit 260B may correspond to a complex logic circuit while the semiconductor chip 200 may comprise further functional components which may extend the functionality of the circuit 260B, for instance the circuit 260 may represent a graphic processing circuit portion and/or a memory circuit that may be connected to the circuit 260B via appropriate electrical interconnect structures, as is also described previously when referring to the device 100. Furthermore, the stacked chip configuration 280 may be formed on the basis of similar process techniques, as previously described with the conventional three-dimensional semiconductor device 100, wherein, however, due to the additional active heat transfer systems 250, 270, 250A, 270A, increased flexibility with respect to designing and arranging the configuration 280 may be obtained since, in general, an increased heat dissipation capability may be provided.

Moreover, due to the "active" nature of the heat transfer systems provided in the stack 280, heat flow may be reversed, for instance, from the heat sink 240 to the temperature critical circuit portion 260B, so that circuit portion 260B may be actively heated, which may be advantageous in an operational phase, in which an appropriate operating temperature may not be ensured for the circuit portion 260B. For example, when the device 280 may be stored in a cold environment and may have to be operated, many of the conventionally designed complex circuit portions may not properly function since the corresponding circuits may typically be designed for a specified temperature range. Thus, upon powering up the device 280 in a cold temperature ambient, at least temperature critical device regions may not properly function, thereby possibly causing a corresponding failure of the entire device 280. In this case, the non-critical features of the corresponding heat transfer systems may be activated to produce heat in the vicinity of the temperature critical device regions prior to actually activating these circuit portions. For instance, during an initialization phase, a corresponding delay of initializing temperature critical circuit portions may be implemented, thereby ensuring that a proper operating temperature is achieved prior to actually activating these critical device portions. In other cases, more sophisticated control regimes may be installed to ensure that temperature critical circuit portions may remain within a specified temperature range, without requiring sophisticated redesigns of existing circuit designs.

Figure 2D:
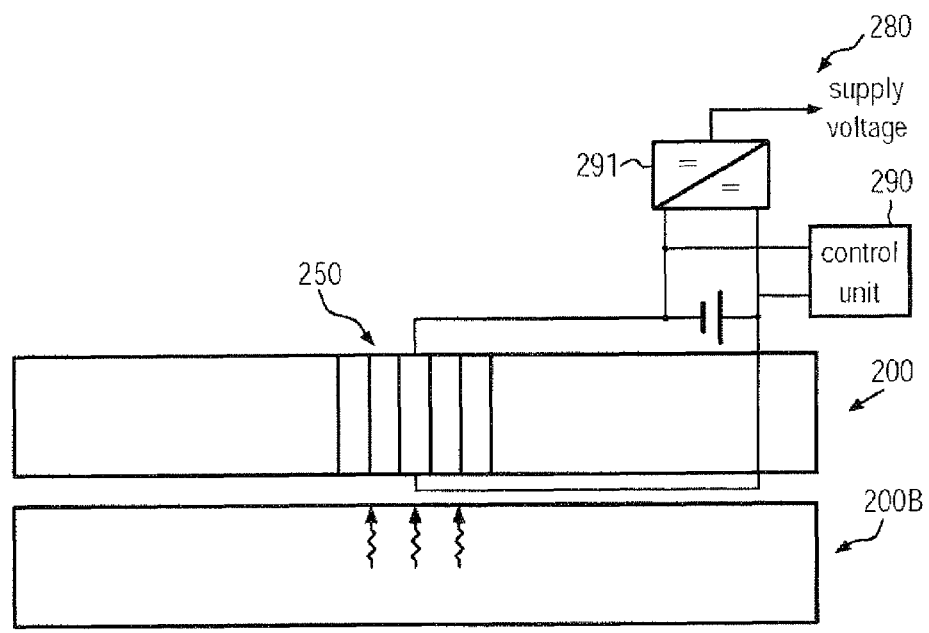
FIG. 2d schematically illustrates a stacked chip configuration including a chip internal current driven heat transfer system which may additionally be connected to a control system for enhanced temperature monitoring and/or to a voltage converter that is configured to provide supply voltage to a supply voltage source on the basis of a thermally induced voltage, according to yet other illustrative embodiments.

With reference to FIG. 2d, further illustrative embodiments will now be described in which enhanced temperature management functionality may be obtained on the basis of the current driven heat transfer system by using the temperature dependent voltage created by at least some of these heat transfer systems.

FIG. 2d schematically illustrates the device 280 according to illustrative embodiments in which at least one heat transfer system, such as the system 250 as previously explained, may be used as a "thermoelectric generator" which may produce a temperature dependent voltage. As is well known, thermoelectric elements or thermocouples may produce a voltage that depends on the temperature gradient between the two different temperature reservoirs or zones, such as the temperature reservoirs 252, 253 (FIG. 2a). Consequently, the heat transfer system 250 may be connected to a control unit 290, which may, for instance, be provided in the form of a respective circuit portion within the chip 200 or any other chip within the stacked chip configuration 280, depending on the requirements with respect to implementing a corresponding control unit into the overall circuit layout. The control unit 290 may further be configured to electrically connect the heat transfer system 250 to a corresponding current source so as to force a current through the system 250 when cooling or heating may be required. For example, if the chip 200B may create increased waste heat, a respective temperature gradient may be established across the heat transfer system 250, which may in turn result in a corresponding voltage that may be detected by the control unit 290. Based on this detected voltage, the control unit 290 may decide, for instance on the basis of a predetermined threshold, whether or not a current may be flown through the system 250 to establish the "cool side" of the system 250 adjacent to the chip 200B. Thereafter, the current flow may be deactivated and a corresponding measurement may be repeated to determine the currently existing temperature gradient across the system 250. Consequently, in this manner, temperature control may be enhanced across the entire stack 280, wherein, for instance, corresponding heat transfer systems in the individual chips may be used as separate temperature sensors and may also be activated individually to obtain corresponding heat flow within the stack 280. For instance, in some operational situations, it may not be necessary to operate each of the corresponding stacked heat transfer systems, for instance when the heat spreading capability of one intermediate chip may be sufficient for maintaining a lower lying temperature critical chip at a specified operating temperature so that any further heat transfer systems above this specific semiconductor chip may not be activated. In still other illustrative embodiments, the thermoelectric voltage produced by the heat transfer system 250 may be supplied to one or more other circuit portions, thereby providing additional energy which may be obtained from the waste heat "flowing" through the heat transfer system 250. For instance, if a substantially stable operating temperature may be established without actively driving current in the system 250, the respective temperature gradient may thus be used for converting at least a fraction of the thermal energy in electric energy. For this purpose, a corresponding DC/DC converter 291 may be provided to appropriately adapt the output voltage of the heat transfer system 250 acting as a thermoelectric generator to the supply voltage level required for operating one or more corresponding circuit portions. For instance, a charge pump may be used to provide an up converted voltage, if the output voltage of the heat transfer system 250 is less than the required supply voltage. In other cases, a down converter may be used when the output voltage is higher than a corresponding supply voltage. It should be appreciated that the control unit 290 may be used as a supervising control entity in order to decide whether or not the heat transfer system 250 is to be used as a thermal sensing device, a voltage generator and/or cooler. For instance, in some cases, a temperature gradient of approximately 100° C. and higher may occur across the heat transfer system 250, while nevertheless an operating temperature of a temperature critical circuit may be within the specifications. In this case, active cooling may not be required and the system 250 may be operated as a thermoelectric generator, thereby enabling a conversion of up to 3-4% of the waste heat into electric energy.

As a result, the present disclosure provides semiconductor devices and methods for enhancing the heat transfer capabilities in semiconductor devices and in some illustrative embodiments in stacked chip configurations by providing a current driven heat transfer system which may be provided in the device level and/or the metallization system of one or more of the semiconductor chips. For this purpose, well-established materials which may also be compatible with typical conventional manufacturing techniques for sophisticated semiconductor devices may be used to form respective thermoelectric units, which may then be appropriately operated to provide the desired heating and/or cooling effect. Furthermore, the provision of active cooling/heating systems may also enable enhanced temperature monitoring and temperature management by using the corresponding heat transfer systems temporarily as temperature sensitive devices. In still other illustrative embodiments, the thermoelectric effect may be used for converting a fraction of the heat energy into electric energy that may be used for supplying corresponding circuit portions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A stacked chip configuration, comprising:
    a first chip comprising a first substrate and first device features formed above said first substrate;
    a second chip positioned above said first chip and comprising a second substrate and second device features formed above said second substrate, at least some of said second device features forming a current driven heat transfer system; and
    a heat sink located above said second chip and thermally coupled to said current driven heat transfer system.

2. The stacked chip configuration of claim 1, wherein a subset of said second device features forms a memory circuit.

3. The stacked chip configuration of claim 1, wherein at least some of said first device features comprise semiconductor elements formed in a device level of said first chip on the basis of at least two different semiconductor materials.

4. The stacked chip configuration of claim 1, wherein at least some of said first device features are formed in a metallization system of said first chip on the basis of at least two different metal materials.

5. The stacked chip configuration of claim 1, wherein said current driven heat transfer system is positioned so as to be aligned to a speed critical device region of said first chip.

6. The stacked chip configuration of claim 1, further comprising a control circuit formed in said second chip and operatively connected to said current driven heat transfer system, wherein said control circuit is configured to determine a thermal state of a portion of said first chip via said current driven heat transfer system.

7. The stacked chip configuration of claim 6, wherein said control circuit is configured to enable a current flow in said heat transfer system to at least one of heating and cooling said portion of said first chip.

8. The stacked chip configuration of claim 7, wherein said control circuit is configured to enable a current flow to cool said portion of said first chip when said first chip is in a specified operating phase.

9. The stacked chip configuration of claim 1, further comprising at least one further chip positioned above said second chip, wherein said at least one further chip comprises a further current driven heat transfer system formed by device features of said at least one further chip.

10. The stacked chip configuration of claim 9, wherein said further current driven heat transfer system is aligned to said current driven heat transfer system formed in said second chip.

11. The stacked chip configuration of claim 1, further comprising a heat spreading material located between said first and second chips, wherein said heat spreading material comprises vertical electrical connections for connecting said first and second chips.

12. The stacked chip configuration of claim 11, wherein said heat spreading material comprises device features forming another current driven heat transfer system.

13. A semiconductor device, comprising:
    a first substrate comprising an electric circuit representing a current driven heat transfer system configured to provide at least one of a heating effect and a cooling effect a specified portion of said semiconductor device positioned above said first substrate; and
    a second substrate comprising a functional circuit portion thermally coupled to said specified portion of said semiconductor device, wherein said second substrate is positioned below said first substrate so as to form a stacked chip configuration.

14. The semiconductor device of claim 13, further comprising a heat spreading material located between said first and second substrates, wherein said heat spreading material comprises vertical electrical connections for connecting said first and second substrates.

15. The semiconductor device of claim 13, further comprising a second functional circuit portion formed on said first substrate.

16. The semiconductor device of claim 15, wherein said second functional circuit portion comprises at least one of a memory circuit and a graphic processing circuit.

17. The semiconductor device of claim 13, further comprising a third substrate positioned above said first substrate and said second substrate, wherein a further current driven heat transfer system is formed on the basis of said third substrate.

18. The semiconductor device of claim 17, wherein said further current driven heat transfer system is vertically aligned to said heat transfer system.

19. A method of controlling temperature in a semiconductor device, the method comprising:
providing a current driven heat transfer system in a chip, wherein said current driven heat transfer system is thermally connected to a first temperature reservoir and a second temperature reservoir located in said chip;
determining a temperature of one of said first and second temperature reservoirs by obtaining a voltage signal from said current driven heat transfer system; and
operating said current driven heat transfer system to cool one of said first and second temperature reservoirs when said semiconductor device is in a specified operating phase.

20. The method of claim 19, wherein said first temperature reservoir is thermally coupled to a functional circuit portion of said semiconductor device and wherein said first temperature reservoir is cooled when a temperature of said functional circuit portion is above a specified temperature.

21. The method of claim 19, wherein said first temperature reservoir is thermally coupled to a functional circuit portion of said semiconductor device and wherein said first temperature reservoir is heated when a temperature of said functional circuit portion is below a specified temperature.

22. The method of claim 19, wherein said first temperature reservoir is thermally coupled to a functional circuit portion of said semiconductor device that is formed in a second chip.

23. The method of claim 19, further comprising obtaining a temperature induced voltage from said current driven heat transfer system and using said temperature induced voltage to supply a functional circuit portion of said semiconductor device.

24. A method of controlling temperature in a semiconductor device, the method comprising:
providing a current driven heat transfer system in a first chip, wherein said current driven heat transfer system is thermally connected to a first temperature reservoir and a second temperature reservoir located in said first chip, and said first temperature reservoir is thermally coupled to a functional circuit portion of said semiconductor device that is formed in a second chip;
operating said current driven heat transfer system to cool one of said first and second temperature reservoirs when said semiconductor device is in a specified operating phase.

25. A method of controlling temperature in a semiconductor device, the method comprising:
providing a current driven heat transfer system in a chip, said current driven heat transfer system thermally connected to a first temperature reservoir and a second temperature reservoir located in said chip;
obtaining a temperature induced voltage from said current driven heat transfer system;
using said temperature induced voltage to supply a functional circuit portion of said semiconductor device, and
operating said current driven heat transfer system to cool one of said first and second temperature reservoirs when said semiconductor device is in a specified operating phase.

* * * * *

UNITED STATES PATENT AND TRADEMARK OFFICE
CERTIFICATE OF CORRECTION

| | | |
|---|---|---|
| PATENT NO. | : 7,924,569 B2 | Page 1 of 1 |
| APPLICATION NO. | : 12/551766 | |
| DATED | : April 12, 2011 | |
| INVENTOR(S) | : Tobias Letz | |

It is certified that error appears in the above-identified patent and that said Letters Patent is hereby corrected as shown below:

IN THE CLAIMS:

Col. 16, line 58 (claim 13, line 4), after "cooling effect" add -- to --.

Signed and Sealed this
Seventeenth Day of May, 2011

David J. Kappos
*Director of the United States Patent and Trademark Office*